US012581731B2

(12) United States Patent
Wang et al.

(10) Patent No.: US 12,581,731 B2
(45) Date of Patent: Mar. 17, 2026

(54) ARRAY SUBSTRATE, METHOD FOR MANUFACTURING THE ARRAY SUBSTRATE AND DISPLAY PANEL

(71) Applicant: BOE TECHNOLOGY GROUP CO., LTD., Beijing (CN)

(72) Inventors: Dongfang Wang, Beijing (CN); Ce Ning, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 723 days.

(21) Appl. No.: 17/789,505

(22) PCT Filed: Jun. 24, 2021

(86) PCT No.: PCT/CN2021/102051
§ 371 (c)(1),
(2) Date: Jun. 27, 2022

(87) PCT Pub. No.: WO2022/266925
PCT Pub. Date: Dec. 29, 2022

(65) Prior Publication Data
US 2024/0178238 A1     May 30, 2024

(51) Int. Cl.
*H10D 86/40*          (2025.01)
(52) U.S. Cl.
CPC ......... *H10D 86/441* (2025.01); *H10D 86/443* (2025.01)
(58) Field of Classification Search
CPC ........................... H10D 86/441; H10D 86/443
See application file for complete search history.

(56) References Cited

U.S. PATENT DOCUMENTS

| 6,177,970 | B1 | 1/2001 | Kim |
| 8,659,710 | B2 | 2/2014 | Shin et al. |
| 8,890,167 | B2 | 11/2014 | Nam et al. |
| 9,391,097 | B2 | 7/2016 | Yuan |

(Continued)

FOREIGN PATENT DOCUMENTS

| CN | 101587268 A | 11/2009 |
| CN | 101887898 A | 11/2010 |

(Continued)

*Primary Examiner* — Peter M Albrecht
(74) *Attorney, Agent, or Firm* — HOUTTEMAN LAW LLC

(57)          ABSTRACT

An array substrate includes: a base; gate lines and data lines on the base; multiple pixel units each including a thin film transistor; first and second conductive layers with a first insulating layer therebetween. The first conductive layer includes a first wiring pattern, the second conductive layer includes a first interconnection pattern, orthographic projections of the first wiring pattern and the first interconnection pattern on the base are at least partially overlapped. The first wiring pattern is connected with the first interconnection pattern through a via hole. Each of part of data lines is located in the first conductive layer and has an auxiliary line formed by the first interconnection pattern in the second conductive layer. The first wiring pattern includes the data lines; at least one of the data line and the first interconnection pattern is connected to a source of the thin film transistor.

13 Claims, 10 Drawing Sheets

(56) References Cited

U.S. PATENT DOCUMENTS

| | | | |
|---|---|---|---|
| 9,588,389 B2 | 3/2017 | Zhou | |
| 2005/0077524 A1 | 4/2005 | Ahn et al. | |
| 2013/0214278 A1* | 8/2013 | Nam | H10D 86/441 |
| | | | 257/59 |
| 2016/0342057 A1* | 11/2016 | Zhang | G02F 1/136286 |

FOREIGN PATENT DOCUMENTS

| | | | |
|---|---|---|---|
| CN | 201845779 U | 5/2011 | |
| CN | 102109722 A | 6/2011 | |
| CN | 102651401 A | 8/2012 | |
| CN | 102955308 A | 3/2013 | |
| CN | 103454798 A | 12/2013 | |
| CN | 103700705 A | 4/2014 | |

* cited by examiner

32
FIG. 1a
211                                                                    17
A
8
A
33   22   34                                                           32
FIG. 1b
211     33          17        34
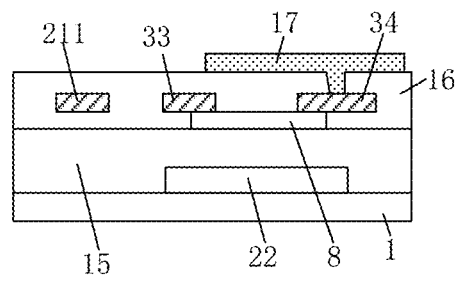
15          22     8     1
16
FIG. 1c

1

ARRAY SUBSTRATE, METHOD FOR MANUFACTURING THE ARRAY SUBSTRATE AND DISPLAY PANEL

TECHNICAL FIELD

The present disclosure relates to the field of display technology, and particularly relates to an array substrate, a method for manufacturing an array substrate and a display panel.

BACKGROUND

At present, display products with high resolution and high refresh rate can improve fineness of image displayed, thereby can improve the display effect and are more and more popular with people.

SUMMARY

Embodiments of the disclosure provides an array substrate, a method for manufacturing an array substrate and a display panel.

In a first aspect, an embodiment of the present disclosure provides an array substrate, including: a base; a plurality of gate lines and a plurality of data lines which are horizontally and vertically arranged on the base; a plurality of pixel units, each pixel unit at least includes a thin film transistor; a first conductive layer and a second conductive layer; and a first insulating layer arranged between the first conductive layer and the second conductive layer; where the first conductive layer includes a first wiring pattern, and the second conductive layer includes a first interconnection pattern;

orthographic projections of the first wiring pattern and the first interconnection pattern on the base are at least partially overlapped with each other; the first wiring pattern is connected with the first interconnection pattern through a via hole formed in the first insulating layer;

among at least part of the data lines, each data line is located in the first conductive layer and is provided with an auxiliary line for the data line, and the auxiliary line for the data line is located in the second conductive layer;

the first wiring pattern includes the data lines, and the first interconnection pattern is configured to be connected with the data lines to form auxiliary lines for the data lines; at least one of the data line and the first interconnection pattern is connected to a source of the thin film transistor.

In some implementations, the first conductive layer and the second conductive layer are sequentially stacked in a direction away from the base;

the first wiring pattern serving as the data lines is a continuous wiring extending in a first direction;

the first interconnection pattern connected with the data lines includes one or more first sub-patterns which are spaced apart from each other, and extending directions of the data lines and the first sub-pattern are consistent;

an orthographic projection of each data line on the base and an orthographic projection of the first sub-pattern corresponding to the data line on the base at least partially overlap with each other;

the via hole includes a first via hole, an orthographic projection of the first via hole on the base is located in an overlapping area of orthographic projections of the data line and the first sub-pattern;

the data line is connected with the first sub-pattern through the first via hole.

In some implementations, the second conductive layer further includes the source and a drain of the thin film transistor;

the first sub-pattern is connected with the source of the thin film transistor;

the first sub-pattern serving as the auxiliary lines for the data lines and the source and the drain of each thin film transistor are formed in a same process, so that the first sub-pattern and the source and the drain of each thin film transistor are located in a same layer, have a same thickness and made of a same material, and the first sub-pattern and the source of each thin film transistor are of an one-piece structure.

In some implementations, the orthographic projection of the first sub-pattern on the base is located within an area of the orthographic projection of the data line on the base; and a plurality of first via holes are provided in an area of the orthographic projection of each first sub-pattern on the base and are spaced apart from each other.

In some implementations, each of the first sub-patterns spaced apart from others of the first sub-patterns is located between two gate lines adjacent to each other;

the number of the first sub-patterns connected with each data line is equal to the number of the gate lines.

In some implementations, five to ten first via holes are provided in each of the first sub-patterns spaced apart from others of the first sub-patterns, and the five to ten first via holes are connected with the data line.

In some implementations, the first conductive layer further includes a gate, and the gate is connected to the gate line through a second via hole formed in the first insulating layer.

In some implementations, the thin film transistor further includes an active layer located on a side of the first insulating layer away from the first conductive layer and on a side of the second conductive layer close to the first insulating layer;

orthographic projections of the active layer and the gate on the base are at least partially overlapped with each other; the source and the drain of the transistor are located at two opposite ends of the active layer respectively, and are connected with the active layer.

In some implementations, the first wiring pattern further includes a third sub-pattern, and an extending direction of the third sub-pattern is the same as that of the gate line;

an orthographic projection of the third sub-pattern on the base is located in an area of an orthographic projection of the gate line on the base;

the via hole further includes a third via hole, an orthographic projection of the third via hole on the base is located in an overlapping area of orthographic projections of the gate line and the third sub-pattern; and the third sub-pattern is connected with the gate line through the third via hole to form an auxiliary line for the gate line.

In some implementations, a plurality of third sub-patterns are provided, and the plurality of third sub-patterns are arranged at intervals in the extending direction of the gate line and are spaced apart from each other;

each of the third sub-patterns spaced apart from others of the third sub-patterns is provided between two data lines adjacent to each other;

the number of the third sub-patterns connected with each gate line is the same as the number of the data lines.

In some implementations, five to ten third via holes are provided in each of the third sub-patterns spaced apart from others of the third sub-patterns, and the third sub-pattern is connected with the gate line through the five to ten third via holes.

In some implementations, the first conductive layer has a thickness less than a thickness of the second conductive layer;

the thickness of the first conductive layer is in a range from 2000 angstroms to 10000 angstroms;

the thickness of the second conductive layer is in a range from 3000 angstroms to 15000 angstroms.

In a second aspect, an embodiment of the present disclosure further provides a display panel, which includes the array substrate described above.

In a third aspect, an embodiment of the present disclosure further provides a method for manufacturing the array substrate described above, the method includes: preparing a plurality of gate lines and a plurality of data lines which are horizontally and vertically arranged, a thin film transistor, a first conductive layer, a first insulating layer and a second conductive layer on a base, where the preparing the first conductive layer includes preparing a first wiring pattern;

the preparing the first insulating layer includes preparing a pattern of a via hole therein;

the preparing the second conductive layer includes preparing a first interconnection pattern;

the first wiring pattern is connected with the first interconnection pattern through the via hole;

the preparing the first wiring pattern includes preparing the data lines;

a source of the thin film transistor and at least one of the data line and the first interconnection pattern are simultaneously formed by a same material.

In some implementations, the method further includes: after preparing the first insulating layer and before preparing the second conductive layer, preparing an active layer, where preparing the first insulating layer and preparing the active layer includes:

forming a first insulating layer film on the base on which the first conductive layer is prepared;

forming an active layer film on the first insulating layer film;

coating a photoresist layer on the active layer film;

exposing the base coated with the photoresist layer by using a halftone mask plate to completely expose a first area of the photoresist layer corresponding to the pattern of the via hole in the first insulating layer, where a second area of the photoresist layer corresponding to a pattern of the active layer is not exposed; and partially exposing an area of the photoresist layer except the first area and the second area;

developing to remove a portion of the photoresist layer in the area exposed, etching an area of the active layer film exposed outside to expose an area of the first insulating layer film outside, and then etching the area of the first insulating layer film exposed outside to form an intermediate pattern of the via hole;

ashing to remove a portion of the photoresist layer in an area except the second area, and reserving a portion of the photoresist layer in the second area;

etching to form a pattern of the active layer; and

etching to form the first insulating layer and a pattern of the via hole in the first insulating layer.

In some implementations, the method further includes: after preparing the first insulating layer and before preparing the second conductive layer, preparing an active layer, where preparing the first insulating layer and preparing the active layer includes:

forming a first insulating layer film on the base on which the first conductive layer is prepared;

coating a photoresist layer on the first insulating layer film, exposing the photoresist layer by adopting a first mask plate including patterns of the first insulating layer and the via hole in the first insulating layer;

developing and then etching to form the patterns of the first insulating layer and the via hole in the first insulating layer;

forming an active layer film on the first insulating layer;

coating a photoresist layer on the active layer film, and exposing the photoresist layer by adopting a second mask plate including a pattern of the active layer; and developing and then etching to form the pattern of the active layer.

DRAWINGS

The accompanying drawings are included to provide a further understanding of the embodiments of the disclosure, and are incorporated in and constitute a part of the present specification, illustrate embodiments of the disclosure and together with the description serve to explain the principles of the disclosure but do not to limit the disclosure. The above and other features and advantages will become more apparent to those skilled in the art by describing exemplary embodiments in detail with reference to the attached drawings, in which:

FIG. 1a is a schematic top view of a partial structure of an underlying conductive layer in the related art;

FIG. 1b is a schematic top view of a partial structure of an array substrate in the related art;

FIG. 1c is a schematic structural cross-sectional view taken along a section line AA in FIG. 1b;

DETAILED DESCRIPTION

Figure 2:
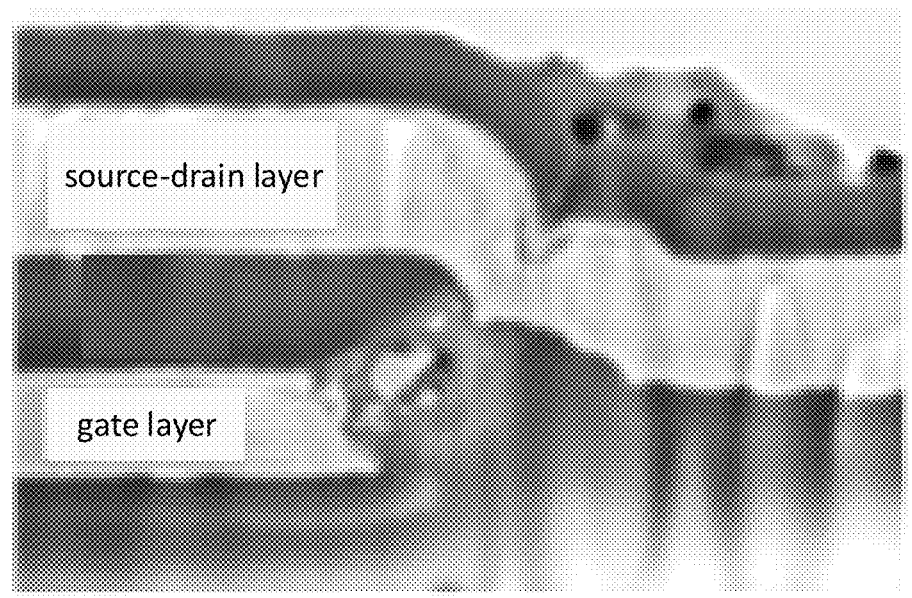
FIG. 2 is a schematic diagram illustrating short circuit between a source, a drain and a gate at different layers in the related art.

In order to make those skilled in the art better understand the technical solutions of the embodiments of the present disclosure, an array substrate, a method for manufacturing an array substrate, and a display panel provided in the embodiments of the present disclosure are described in detail below with reference to the accompanying drawings.

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the disclosure without increative effort, are within the protection scope of the present disclosure.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the words "a," "an," or "the" and similar referents do not denote a limitation of quantity, but rather denote the presence of at least one. The word "comprising" or "including", and the like, means that the element or item preceding the word includes the element or item listed after the word and its equivalent, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when the absolute position of the object being described is changed, the relative positional relationships may also be changed accordingly.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, regions illustrated in the drawings have schematic properties, and shapes of the regions shown in the drawings illustrate specific shapes of the regions, but are not intended to be limiting.

At present, with increase of a demand for display products with higher resolution and refresh rate, for example, the display products with 8K and 16K resolution are more and more popular, a resistance of metal wiring in the display products becomes an important aspect restricting the capability of the display products, in order to ensure normal display of the display products with high resolution and high refresh rate, the resistance of the metal wiring in the display products is desired to be lower and lower, at present, the resistance of the metal wiring is mainly reduced by increasing a thickness of the metal wiring, and thus requirements on the thickness of the metal wiring in the display products are higher and higher, and the increase of the thickness of the metal wiring easily causes short circuit between adjacent metal wiring layers in different layers, resulting in reduction of the yield of the display products.

As for a current liquid crystal display panel with 8K or 16K resolution, the number of sub-pixels therein is increased, and charging time of each sub-pixel is reduced under a condition of ensuring normal display of each sub-pixel, and thus delay time for scanning each sub-pixel is desired to be shortened; on the basis of ensuring that the product with high resolution keeps the delay time of an original product with a low resolution, resistances of a gate line and a data line in the liquid crystal display panel are desired to be reduced. Referring to FIGS. 1*a* to 1*c*, a gate line 32 and a data line 211 are respectively located in different layers of an array base 1 in the liquid crystal display panel, for example, the gate line 32 is located in a lower layer, and the data line 211 is located in an upper layer; the gate line 32 and the data line 211 are spaced apart and insulated from each other by an insulating layer 15. At present, the resistances of the gate line 32 and the data line 211 are reduced mainly by increasing thicknesses of metal wiring layers of the gate line 32 and the data line 211, for example, for the liquid crystal display panel with 16K resolution, the thicknesses of the metal wiring layers of the gate line 32 and the data line 211 are desired to be more than 1 μm. A pixel circuit is formed in the array substrate, and a gate 22 of a thin film transistor in the pixel circuit and the gate line 32 are made of a same material and are formed in a same layer; a source 33 and a drain 34 of the transistor and the data line 211 are made of a same material and are formed in a same layer, and the source 33 is connected with the data line 211; the source 33 and the drain 34 are respectively connected to an active layer 8 therebelow; a passivation layer 16 is provided above the source 33 and the drain 34, a via hole is formed in the passivation layer 16, and a pixel electrode 17 arranged above the passivation layer 16 is connected with the drain through the via hole; the increase in the thickness of the metal wiring layer of the gate line 32 increases a slope angle at edge positions of the gate line 32 and the gate 22, which results in a poor film formation of the insulating layer 15 formed over the gate line 32 and the gate 22 at the edge positions of the gate line 32 and the gate 22, for example, an uneven film may be formed, and the risk of short circuit between the gate 22 and the source 33, the drain 34 correspondingly located above the edge positions of the gate (see FIG. 2) is increased, and the yield of products is reduced.

Figure 3:
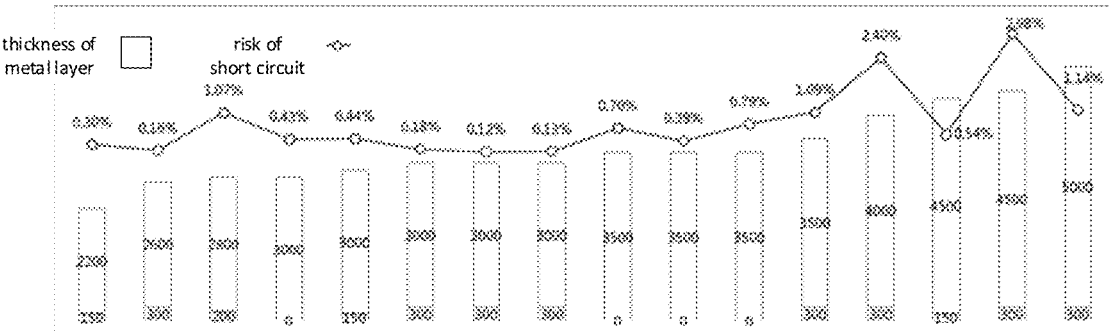
FIG. 3 is a schematic diagram illustrating a trend of a risk of short circuit between a source, a drain and a gate with increase of a thickness of a metal wiring layer for forming a gate line in the related art.

In the current mass-produced products, referring to FIG. 3, with the increase of the thickness of the metal wiring layer of the gate line, the risk of short circuit between the gate and the source/drain appears in an obvious rising trend. In FIG. 3, the rectangular bar represents the thickness of the metal wiring layer of the gate line, and the unit thereof is angstrom; a broken line connecting multiple points above the rectangular bars represents proportions of the risk of short circuit between the gate and the source/drain.

In addition, with the resolution of the display product higher and higher, the requirement for the thickness of the metal wiring layer is higher and higher, and the higher and higher requirement for the thickness of the metal wiring layer may also cause reduction in production capacity of a film manufacturing process (for example, reduction in the production capacity of a film deposition process), so that the production cost of the product is increased.

In view of the problems of reduction in the yield of products and increase in the cost caused by increasing the thickness of the metal wiring layer in the current display product with high resolution, embodiments of the present disclosure provides the following technical solutions.

Figure 4:
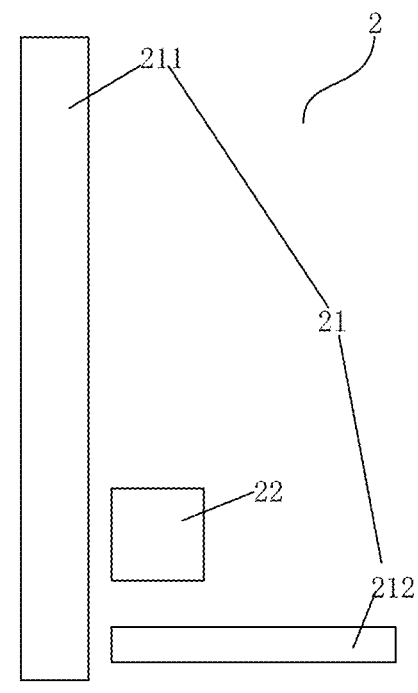
FIG. 4 is a schematic top view of a partial structure of a first conductive layer according to an embodiment of the present disclosure.
Figure 5:
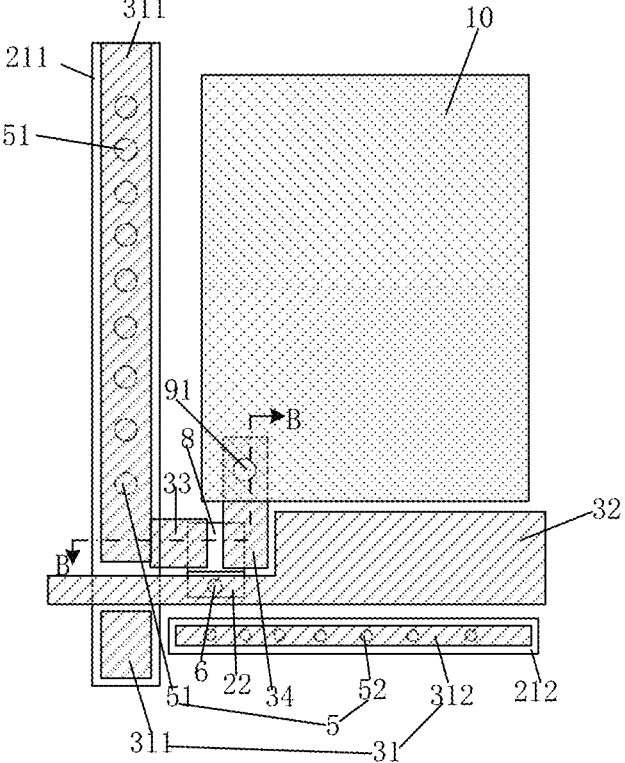
FIG. 5 is a schematic top view of a partial structure of an array substrate according to an embodiment of the present disclosure.
Figure 6:
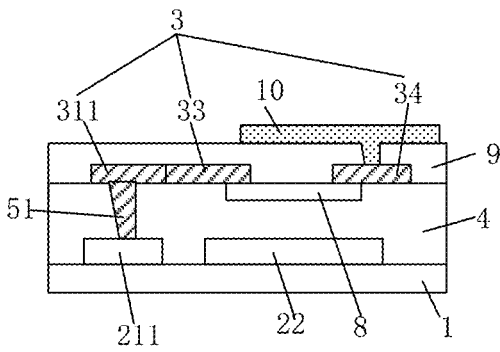
FIG. 6 is a schematic structural cross-sectional view taken along a section line BB in FIG. 5.

In a first aspect, an embodiment of the present disclosure provides an array substrate, with reference to FIGS. 4 to 6, the array substrate includes: a base 1, a plurality of gate lines 32 and a plurality of data lines 211 which are horizontally and vertically arranged on the base 1, and a plurality of pixel units, each pixel unit at least includes a thin film transistor; and a first conductive layer 2 and a second conductive layer 3. A first insulating layer 4 is arranged between the first conductive layer 2 and the second conductive layer 3. The first conductive layer 2 includes a first wiring pattern 21, the second conductive layer 3 includes a first interconnection pattern 31, orthographic projections of the first wiring pattern 21 and the first interconnection pattern 31 on the base 1 are at least partially overlapped with each other. The first wiring pattern 21 is connected with the first interconnection pattern 31 through a via hole 5 formed in the first insulating layer 4. Among at least part of the data lines 211, each data line 211 is located in the first conductive layer 2, each data line 211 is provided with an auxiliary line for the data line, and the auxiliary line for the data line is located in the second conductive layer 2. The first wiring pattern 21 includes data lines 211, and the first interconnection pattern 31 is configured to be connected with the data lines 211 to form auxiliary lines for the data lines; at least one of the data line 211 and the first interconnection pattern 31 is connected with the source 33 of the thin film transistor.

The first interconnection pattern 31 connected with first wiring pattern 21 is provided in the second conductive layer 3, so that an area of a cross section, perpendicular to the base 1, of the first wiring pattern 21 in the first conductive layer 2 can be increased under a condition that a thickness of the first wiring pattern 21 is reduced, thereby the resistance of first wiring pattern 21 is reduced, further, the problems of reduction of the yield of products and increase in cost caused by the increase of the thickness of the first wiring pattern 21 are improved or avoided, and the display effect of the display panel adopting the array substrate for displaying with high resolution and high refresh rate is improved.

In some implementations, the first wiring pattern 21 includes a data line 211, the first interconnection pattern 31 includes a first sub-pattern 311, orthographic projections of the data line 211 and the first sub-pattern 311 on the base 1 at least partially overlaps with each other; the via hole 5 includes a first via hole 51, and an orthographic projection of the first via hole 51 on the base 1 is located in an overlapping area of the orthographic projections of the data line 211 and the first sub-pattern 311 on the base 1, i.e., an area in which the orthographic projections of the data line 211 and the first sub-pattern 311 on the base 1 overlap with each other, the data line 211 is connected with the first sub-pattern 311 through the first via hole 51.

In some implementations, the first conductive layer 2 and the second conductive layer 3 are sequentially stacked in a direction away from the base 1; the first wiring pattern 21 serving as the data line 211 is a continuous wiring extending along a first direction. The first interconnection pattern 31 connected to the data line 211 includes one or more first sub-patterns 311 spaced apart from each other, and the first sub-patterns 311 each extend in the same direction as the data line 211. The orthographic projections of the data line 211 and the first sub-patterns 311 on the base 1 at least partially overlap with each other. The via hole 5 includes a first via hole 51, and an orthographic projection of the first via hole 51 on the base 1 is located in an overlapping area of the orthographic projections of the data line 211 and the first sub-pattern 311 on the base 1, i.e., an area in which the orthographic projections of the data line 211 and the first sub-pattern 311 on the base 1 overlap with each other. The data line 211 is connected with the first sub-pattern 311 through the first via hole 51. By connecting the data line 211 in the first conductive layer 2 with the first sub-pattern 311 in the second conductive layer 3, an area of a cross section of the data line 211 perpendicular to the base 1 can be increased, so that the resistance of the data line 211 is reduced, the problems of reduction of the yield of products and increase in cost caused by the increase of the thickness of the data line 211 in the first conductive layer 2 are improved or avoided, and the display effect of the display panel adopting the array substrate for displaying with high resolution and high refresh rate is improved.

In some implementations, referring to FIG. 6, the second conductive layer 3 further includes a source 33 and a drain 34 of the thin film transistor, the first sub-pattern 311 is connected to the source 33 of the thin film transistor. The first sub-pattern 311 serving as the auxiliary line for the data line and the source 33 and the drain 34 of the thin film transistor are formed in a single process, such that the first sub-pattern 311 and the source 33 and the drain 34 of the thin film transistor are located in a same layer, have a same thickness, and are made of a same material, and the first sub-pattern 311 and the source 33 of the thin film transistor are formed into an one-piece structure. Thus, the first sub-pattern 311 and the source 33 and the drain 34 can be simultaneously formed through one patterning process, thereby saving process steps and reducing manufacturing cost.

In some implementations, referring to FIG. 5, the orthographic projection of the first sub-pattern 311 on the base 1 is located within the orthographic projection of the data line 211 corresponding to the first sub-pattern 311 on the base 1. A plurality of first via holes 51 are provided in an area of the orthographic projection of each first sub-pattern 311 on the base 1, and the plurality of first via holes 51 are distributed at intervals. The plurality of first via holes 51 are provided, so that, on one hand, an area of a cross section of the data line 211 perpendicular to the base 1 can be further increased, thereby further reducing the resistance of the data line 211, on the other hand, the connection stability of the data line 211 with the first sub-pattern 311 can be improved. Certainly, only one first via hole 51 being provided is feasible, as long as the resistance of the data line 211 meets the requirement and the connection stability of the data line 211 with the first sub-pattern 311 is ensured.

In some implementations, five to ten first via holes 51 are provided in each of the first sub-patterns 311 spaced apart from others of the first sub-patterns 311, and each first sub-pattern 311 is connected with the data line 211 corresponding the first sub-pattern 311 through the five to ten first via holes 51.

Figure 7:
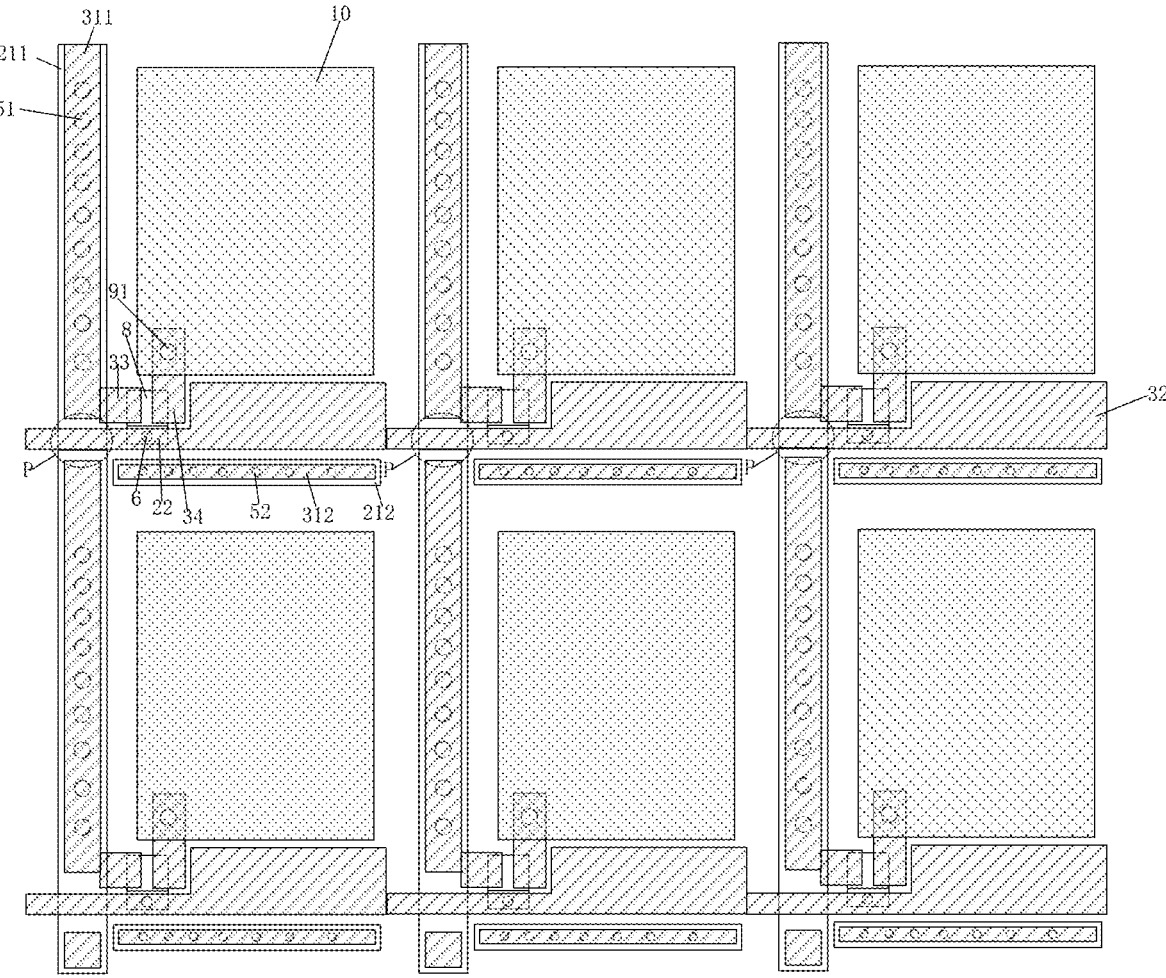
FIG. 7 is a schematic top view of an array substrate according to an embodiment of the present disclosure.

In some implementations, referring to FIG. 7, a plurality of data lines 211 are provided and a plurality of first sub-patterns 311 are provided, and the second conductive layer 3 further includes a plurality of gate lines 32. The plurality of data lines 211 spatially intersect with the plurality of gate lines 32 to form intersections P, orthographic projections of the first sub-patterns 311 on the base 1 do not overlap with orthographic projections of the intersections P on the base 1. That is, the first interconnection pattern 31 is disconnected at positions of the intersections P, and since the first interconnection pattern 31 and the gate lines 32 are all located in the second conductive layer 3, the first interconnection pattern 31 being disconnected at the positions of the intersections P can prevent the first interconnection pattern 31 from being connected with the gate lines 32 in the same layer, and thus prevent the data lines 211 located in the first conductive layer 2 from being connected with the gate lines 32 located in the second conductive layer 3. The first sub-pattern 311 located in a region other than the intersection P is connected to the data line 211 corresponding thereto, so that the area of the cross section of the data line 211 perpendicular to the base 1 can be increased, thereby reducing the resistance of the data line 211 and reducing the thickness of the data line 211 located in the first conductive layer 2.

In some implementations, each of the first sub-patterns 311 spaced apart from others of the first sub-patterns 311 is provided between two gate lines 32 adjacent to each other; the number of the plurality of first sub-patterns 311 connected to each data line 211 is the same as the number of the gate lines 32.

In the embodiment, the number of the data lines 211 is greater than the number of the gate lines 32. The gate lines 32 spatially intersect with the data lines 211, and the number of intersections P formed by each gate line 32 spatially intersecting with the data lines 211 is greater than the number of intersections P formed by each data line 211 spatially intersecting with the gate lines 32, so that the data lines 211 being provided in the first conductive layer 2 can reduce the number of the intersections P to be crossed over by the first interconnection pattern 31 disposed in the second conductive layer 3, and difficulty and cost of a manufacturing process of a mask plate used for forming the pattern of the second conductive layer 3 can be reduced.

In some implementations, the first conductive layer 2 further includes the gates 22, each gate 22 is connected to the gate line 32 through a second via hole 6 formed in the first insulating layer 4; the second conductive layer 3 further includes a source 33 and a drain 34 of the thin film transistor, and the source 33 is connected to the first sub-pattern 311. Since a thickness of the gate 22 in the first conductive layer 2 may be relatively small, the slope angle at the edge position of the gate 22 is relatively small, which makes the film of the first insulating layer 4 formed at the edge position of the corresponding gate 22 be relatively smooth, thereby improving or avoiding the occurrence of short circuit between the gate 22 and the source 33, drain 34 correspondingly located above the edge position of the gate 22, and ensuring the yield of the array substrate.

In some implementations, the thin film transistor further includes an active layer 8, the active layer 8 is located on a side of the first insulating layer 4 away from the first conductive layer 2 and on a side of the second conductive layer 3 close to the first insulating layer 4; orthographic projections of the active layer 8 and the gate 22 on the base 1 are at least partially overlapped with each other; the source 33 and the drain 34 are positioned at opposite ends of the active layer 8, respectively, and the source 33 and the drain 34 are connected to the active layer 8.

The gate 22, the first insulating layer 4, the active layer 8, the source 33 and the drain 34 constitute the thin film transistor in the array substrate, and the thin film transistor is a main device of the pixel circuit in the array substrate. The thin film transistor in the embodiment is of a bottom-gate type, and the thin film transistor may also be of a top-gate type. A material of the active layer 8 may include, for example, an inorganic semiconductor material (e.g., polycrystalline silicon, amorphous silicon, etc.), an organic semiconductor material, and an oxide semiconductor material (e.g., indium gallium zinc oxide (IGZO)). The active layer 8 includes a channel portion, and a source connection portion and a drain connection portion on both sides of the channel portion, the source connection portion is connected to the source 33, and the drain connection portion is connected to the drain 34. Each of the source connection portion and the drain connection portion may be doped with an impurity (e.g., an N-type impurity or a P-type impurity) having a higher impurity concentration than that doped in the channel portion. The channel portion is directly opposite to the gate 22, and when a voltage signal applied to the gate 22 reaches a predetermined value, a carrier path is formed in the channel portion, and thus an electric current can flow between the source 33 and the drain 34 of the thin film transistor.

In some implementations, a thickness of the active layer 8 made of a material such as indium gallium zinc oxide (IGZO) is in a range from 10 nm to 80 nm.

In some implementations, the first wiring pattern 21 further includes a common electrode line 212; the first interconnection pattern 31 further includes a second sub-pattern 312; orthographic projections of the common electrode line 212 and the second sub-pattern 312 on the base 1 at least partially overlap with each other. The via hole 5 further includes a fourth via hole 52, an orthographic projection of the fourth via hole 52 on the base 1 is located in an overlapping area of the orthographic projections of the common electrode line 212 and the second sub-pattern 312 on the base 1, i.e., an area in which the orthographic projections of the common electrode line 212 and the second sub-pattern 312 on the base 1 overlap with each other, and the common electrode line 212 is connected with the second sub-pattern 312 through the fourth via hole 52. By connecting the common electrode line 212 in the first conductive layer 2 with the second sub-pattern 312 in the second conductive layer 3, an area of a cross section of the common electrode line 212 perpendicular to the base 1 can be increased, so that a resistance of the common electrode line 212 is reduced, the problems of reduction of the yield of products and increase in cost caused by the increase of the thickness of the common electrode line 212 in the first conductive layer 2 are improved or avoided, and the display effect of the display panel adopting the array substrate for displaying with high resolution and high refresh rate is improved.

In the case where the first wiring pattern 21 includes the common electrode line 212, if the display panel adopting the array substrate is a TN (Twisted Nematic) type liquid crystal display panel, the common electrode line 212 is disposed in the first conductive layer 2, and the resistance of the common electrode line 212 is desired to be relatively low for achieving a liquid crystal display panel with high resolution.

In some implementations, a plurality of fourth via holes 52 are provided, and the fourth via holes 52 are provided spaced apart from each other. The plurality of fourth via holes 52 are provided, so that, on one hand, the area of the cross section of the common electrode line 212 perpendicular to the base 1 can be further increased, so as to further reduce the resistance of the common electrode line 212, and on the other hand, the stability of the connection between the common electrode line 212 and the second sub-pattern 312 can be improved. Certainly, only one fourth via hole 52 being provided is feasible, as long as the resistance of the common electrode line 212 meets the requirement and the stability of the connection between the common electrode line 212 and the second sub-pattern 312 can be ensured.

In some implementations, a thickness of the first conductive layer 2 is less than a thickness of the second conductive layer 3, and the thickness of the first conductive layer 2 is in a range from 2000 angstrom to 10000 angstrom. The thickness of the first conductive layer 2 is a dimension of the first conductive layer 2 in a direction away from the base 1. The thickness of the second conductive layer 3 is in a range from 3000 angstrom to 15000 angstrom. The thickness of the second conductive layer 3 is a dimension of the second conductive layer 3 in the direction away from the base 1. The thickness of the second conductive layer 3 may be larger, so that the resistance of the wiring pattern in the second conductive layer 3 is reduced, and the display effect of the display panel adopting the array substrate for displaying with high resolution and high refresh rate can be improved. Since the second conductive layer 3 is located on the side of the first conductive layer 2 away from the base 1, i.e., the second conductive layer 3 is located on an upper layer relative to the base 1 than the first conductive layer 2, the increase of the thickness of the second conductive layer 3 would not cause a risk of short circuit between the second conductive layer 3 and the first conductive layer 2.

In some implementations, compared with the thicknesses, resistances, and delay time that can be achieved for the gate lines in the first conductive layer and the data lines in the second conductive layer in the related art, the thicknesses of the data lines in the first conductive layer and the gate lines in the second conductive layer in the embodiment of the present disclosure are significantly reduced while ensuring that the same resistances and delay time as those in the related art are achieved; the thickness of the first conductive layer in the embodiment of the present disclosure is reduced to 6000 angstroms from 8000 angstroms in the related art. Since the first conductive layer has a reduced thickness, the risk of short circuit between the first conductive layer and the second conductive layer at a local position (e.g., a edge position of the first conductive layer corresponding to the second conductive layer) is reduced, and therefore, the thickness of the second conductive layer in the embodiment of the present disclosure can be reduced accordingly, e.g., the thickness of the second conductive layer in the embodiment of the present disclosure is reduced to 8000 angstroms from 12500 angstroms in the related art.

In some implementations, the first conductive layer 2 includes a single or multiple conductive sub-layers; the second conductive layer 3 includes a single or multiple conductive sub-layers; the multiple conductive sub-layers are stacked in sequence.

In some implementations, a material of the first conductive layer 2 may include, for example, metal, metal alloy, metal nitride, conductive metal oxide, transparent conductive material, and the like. For example, the material of the first conductive layer 2 may include gold, gold alloy, silver, silver alloy, aluminum, aluminum alloy, aluminum nitride, tungsten, tungsten nitride, copper, copper alloy, nickel, chromium, chromium nitride, molybdenum, molybdenum alloy, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, or the like.

In some implementations, a material of the second conductive layer 3 may include metal, alloy, metal nitride, conductive metal oxide, transparent conductive material, and the like, for example, the second conductive layer 3 may be of a single-layered structure or a multi-layered structure formed of metal, such as Mo/Al/Mo, Ti/Al/Ti, MoNb/Cu, or MoTiNi/Cu.

In the embodiment, the array substrate further includes a second insulating layer 9 and a first electrode 10, where the second insulating layer 9 is located on a side of the second conductive layer 3 away from the base 1; the first electrode 10 is located on a side of the second insulating layer 9 away from the base 1. A fifth via hole 91 is formed in the second insulating layer 9, and the first electrode 10 is connected to the drain 34 through the fifth via hole 91. The first electrode 10 may be a pixel electrode in the array substrate of the liquid crystal display panel.

In some implementations, the first electrode 10 may also be an anode in an array substrate of an OLED display panel.

In some implementations, a material of the first insulating layer 4 and the second insulating layer 9 may include silicon compound and metal oxide. For example, the material of the first insulating layer 4 and the second insulating layer 9 includes silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. In addition, each of the first insulating layer 4 and the second insulating layer 9 may be of a single-layered structure or a multi-layered structure.

In some implementations, a thickness of the first insulating layer 4 is in a range from 200 nm to 500 nm. A thickness of the second insulating layer 9 is in a range from 200 nm to 400 nm.

In some implementations, the first electrode 10, as the pixel electrode, may be a single-layered light-transmitting conductive structure, a material of the first electrode 10 may be indium tin oxide (ITO), silver (Ag), or indium zinc oxide (IZO). Certainly, the first electrode 10 may also be of a stacked multi-layered light-transmitting conductive structure, for example, the multi-layered light-transmitting conductive structure may include: an ITO layer and an Ag layer stacked in a direction away from the base 1; alternatively, the multi-layered light-transmissive conductive structure may include an Ag layer and an ITO layer stacked in a direction away from the base 1; still alternatively, the multi-layered light-transmissive conductive structure may include an IZO layer and an ITO layer stacked in a direction away from the base 1; further still alternatively, the multi-layered light-transmissive conductive structure may include an ITO layer, an Ag layer and an ITO layer which are stacked in a direction away from the base 1.

In some implementations, the first electrode 10, as the anode, may be of a single-layered or multi-layered metal conductive structure, and a material of the metal conductive structure includes silver (Ag), and may also include metal such as magnesium (Mg), aluminum (Al), platinum (Pt), gold (Au), nickel (Ni), and neodymium (Nd).

In some implementations, a thickness of the first electrode 10 is in a range from 40 nm to 135 nm.

Figure 8A:
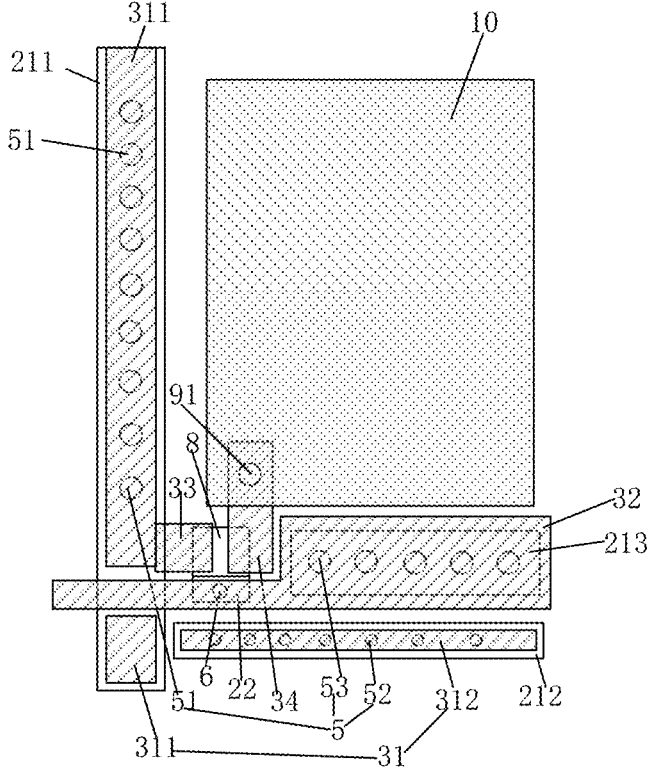
FIGS. 8a and 8b are schematic top views illustrating a structure of an array substrate according to an embodiment of the present disclosure.
Figure 8B:
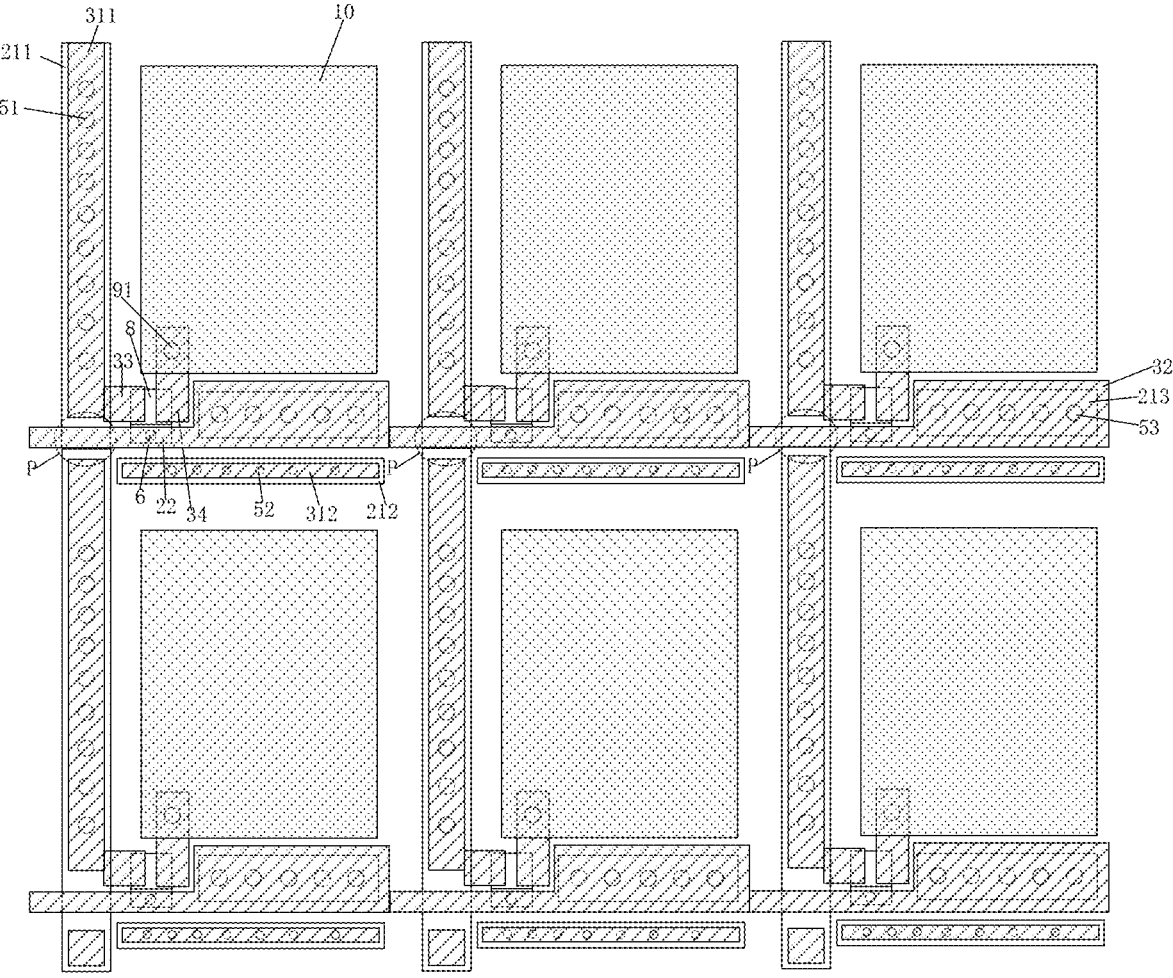

In some implementations, referring to FIGS. 8a to 8b, on the basis of the array substrate shown in FIG. 5, the first wiring pattern 21 further includes a third sub-pattern 213, and the third sub-pattern 213 extends in the same direction as the gate line 32. An orthographic projection of the third sub-pattern 213 on the base 1 is located in an area of the orthographic projection of the gate line 32 on the base 1. The via hole 5 further includes a third via hole 53, and an orthogonal projection of the third via hole 53 on the base 1 is located in an overlapping area of the orthogonal projections of the gate line 32 and the third sub-pattern 213 on the base 1, i.e., an area in which the orthogonal projections of the gate line 32 and the third sub-pattern 213 on the base 1 overlap with each other. The third sub-pattern 213 is connected to the gate line 32 through the third via hole 53 to form an auxiliary line for the gate line. By connecting the gate line 32 in the second conductive layer 3 with the third sub-pattern 213 in the first conductive layer 2, an area of a cross section of the gate line 32 perpendicular to the base 1 can be increased, so that the resistance of the gate line 32 is reduced, and the display effect of the display panel adopting the array substrate for displaying with high resolution and high refresh rate is improved.

In some implementations, referring to FIGS. 8*a* to 8*b*, a plurality of third sub-patterns 213 are provided, and the plurality of third sub-patterns 213 are arranged at intervals along the extending direction of the gate line 32 (i.e., a direction in which the gate lines 32 extends) and spaced apart from each other; each of the third sub-patterns 213 spaced apart from others of the third sub-patterns 213 are distributed between adjacent two of the data lines 211; The number of the third sub-patterns 213 connected to each gate line 32 is the same as the number of the data lines 211. That is, the third sub-patterns 213 are spaced apart from each other at the intersections P at which each gate line 32 intersects with the data lines 211, so that the third sub-pattern 213 can be prevented from being connected with the data lines 211 in the same layer, and thus the data lines 211 in the first conductive layer 2 can be prevented from being connected with the gate line 32 in the second conductive layer 3. The third sub-pattern 213 located at a region other than the intersections P is connected to the gate line 32, so that the area of the cross section of the gate line 32 perpendicular to the base 1 can be increased, thereby reducing the resistance of the gate line 32.

In some implementations, referring to FIGS. 8*a* to 8*b*, five to ten third via holes 53 are provided in each of the third sub-patterns 213 spaced apart from others of the third sub-patterns 213, and the third sub-pattern 213 is connected with the gate line 32 corresponding thereto through the five to ten third via holes 53. The third via holes 53 are provided in each third sub-pattern 213, so that, on one hand, the area of the cross section of the gate line 32 perpendicular to the base 1 can be further increased, and the resistance of the gate line 32 can be further reduced, on the other hand, the stability of the connection between the gate line 32 with the third sub-pattern 213 can also be improved. Certainly, only one third via hole 53 being provided is feasible, as long as the resistance of the gate line 32 meets the requirement and the stability of the connection between the gate line 32 and the third sub-pattern 213 can be ensured.

Figure 9A:
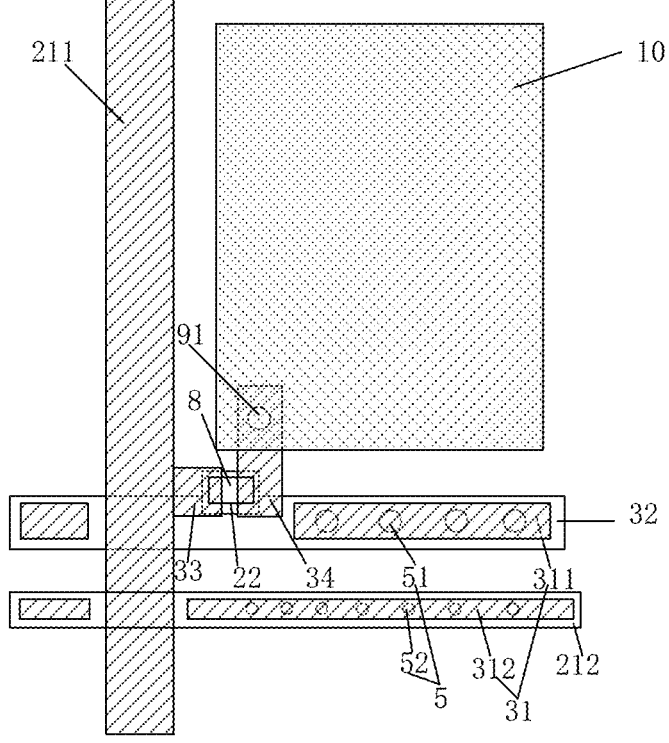
FIGS. 9a and 9b are schematic top views illustrating a structure of an array substrate according to an embodiment of the present disclosure.
Figure 9B:
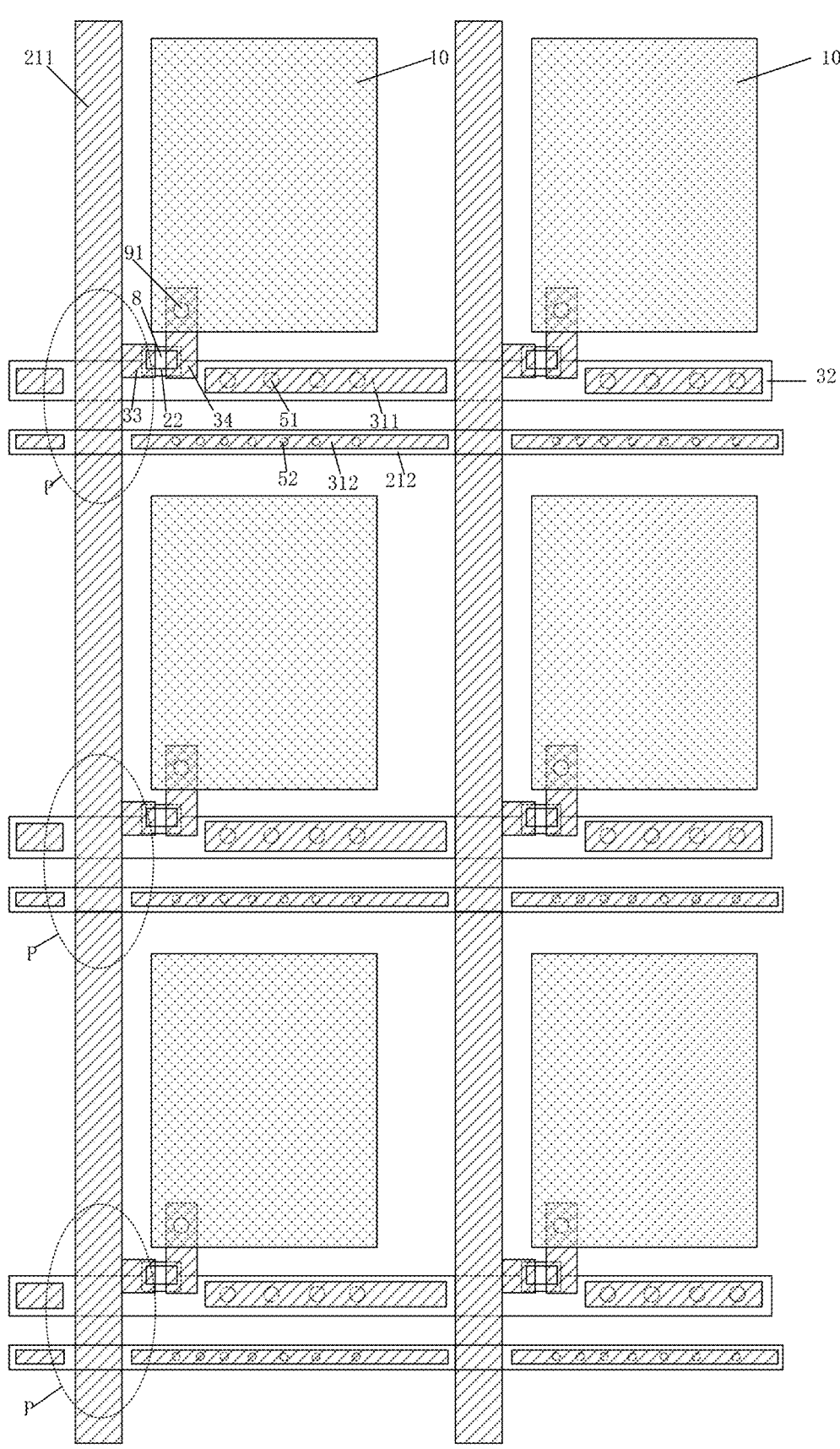

In some implementations, unlike the arrangement in the above embodiment, referring to FIGS. 9*a* to 9*b*, the first wiring pattern 21 includes a gate line 32, the first interconnection pattern 31 includes a first sub-pattern 311. Orthographic projections of the gate line 32 and the first sub-pattern 311 on the base 1 at least partially overlap with each other. The via hole 5 includes a first via hole 51, and an orthographic projection of the first via hole 51 on the base 1 is located in an overlapping area of the orthographic projections of the gate line 32 and the first sub-pattern 311 on the base 1, i.e., an area in which the orthographic projections of the gate line 32 and the first sub-pattern 311 on the base 1 overlap with each other. The gate line 32 is connected with the first sub-pattern 311 through the first via hole 51.

In some implementations, a plurality of gate lines 32 are provided. A plurality of first sub-patterns 311 are provided. The second conductive layer 3 further includes a plurality of data lines 211. The plurality of data lines 211 spatially intersect with the plurality of gate lines 32 to form intersections P. Orthographic projections of the first sub-patterns 311 do not overlap with orthographic projections of the intersections P on the base 1. That is, the first interconnection pattern 31 is disconnected at positions of the intersections P, and since the first interconnection pattern 31 and the data lines 211 are both located in the second conductive layer 3, the first interconnection pattern 31 is disconnected at the positions of the intersections P, so that the first interconnection pattern 31 can be prevented from being connected with the data lines 211 in the same layer, and thus the gate lines 32 located in the first conductive layer 2 can be prevented from being connected with the data lines 211 located in the second conductive layer 3. The first sub-pattern 311 located in a region other than the intersection P is connected to the gate line 32, so that an area of a cross section of the gate line 32 perpendicular to the base 1 can be increased, thereby reducing the resistance of the gate line 32, and simultaneously reducing a thickness of the gate line 32 located in the first conductive layer 2.

In some implementations, the number of data lines 211 is less than the number of gate lines 32. Since the number of the intersections P formed by each gate line 32 spatially intersecting with the data lines 211 is less than the number of the intersections P formed by each data line 211 spatially intersecting with the gate lines 32, providing the gate lines 32 in the first conductive layer 2 can reduce the number of the intersections P to be crossed over by the first interconnection pattern 31 disposed in the second conductive layer 3, and difficulty and cost of a manufacturing process of a mask plate used for forming the pattern of the second conductive layer 3 can be reduced.

Based on the above structure of the array substrate, an embodiment of the present disclosure further provides a method for manufacturing the array substrate, where the method includes: preparing a plurality of gate lines and a plurality of data lines which are horizontally and vertically arranged, a thin film transistor, a first conductive layer, a first insulating layer and a second conductive layer on the base 1. The preparing the first conductive layer includes preparing a first wiring pattern. The preparing the first insulating layer includes preparing a pattern of a via hole therein. The preparing the second conductive layer includes preparing a first interconnection pattern, where the first wiring pattern is connected with the first interconnection pattern through the via hole. The preparing the first wiring pattern includes preparing the data lines. At least one of the data line and the first interconnection pattern is formed simultaneously with a source of the thin film transistor by using a same material.

In the embodiment of the present disclosure, a specific manufacturing process of the array substrate is described by taking the array substrate shown in FIG. 6 and FIG. 7 as an example.

Figure 10:
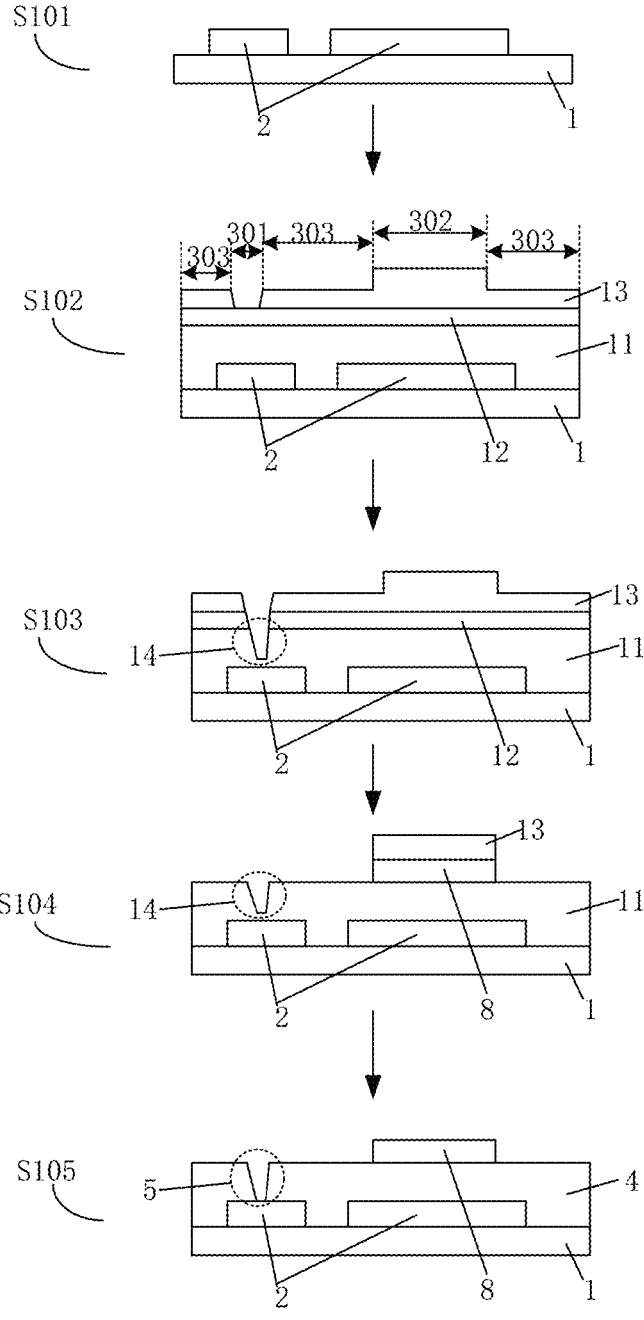
FIG. 10 is a flowchart illustrating a portion of steps in a method for manufacturing an array substrate according to an embodiment of the present disclosure.
Figure 11:
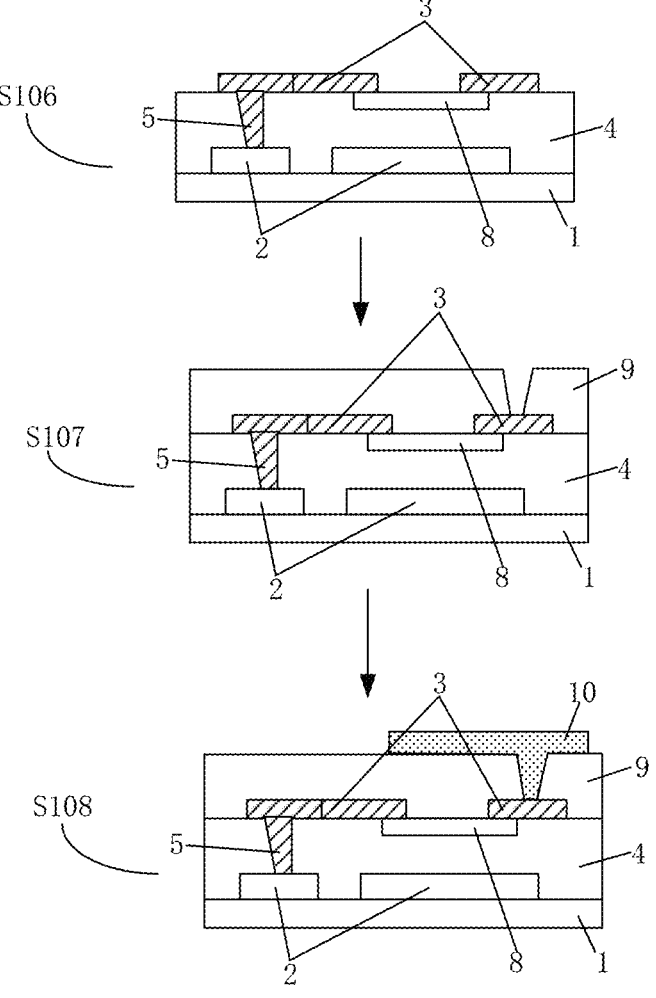
FIG. 11 is a flowchart illustrating a portion of steps in a method for manufacturing an array substrate according to an embodiment of the present disclosure.

In the embodiment of the present disclosure, referring to FIG. 10, the method for manufacturing the array substrate may include steps S101 to S105.

At step S101, perparing a pattern for forming a first conductive layer 2 on a base 1.

The first conductive layer 2 and the first wiring pattern in the first conductive layer may be prepared by a patterning process (including steps of film formation, exposure, development, etching, and the like).

In the embodiment of the present disclosure, the method for manufacturing the array substrate may further include: after preparing the first insulating layer and before preparing the second conductive layer, preparing an active layer.

In some implementations, the preparing the first insulating layer 4 and preparing the active layer 8 includes the step S102.

At step S102, forming a first insulating layer film 11 on the base 1 on which the first conductive layer 2 is prepared; forming an active layer film 12 on the first insulating layer film 11; coating a photoresist layer 13 on the active layer film 12; exposing the base 1 coated with the photoresist layer 13 by using a halftone mask plate, so that a first area 301 of the photoresist layer 13 corresponding to the pattern of the via hole in the first insulating layer is completely exposed, a second area 302 of the photoresist layer 13 corresponding to a pattern of the active layer is not exposed, and an area of the photoresist layer 13 except the first region 302 and second region 303 is partially exposed; and developing and removing the portion of the photoresist layer 13 in the area exposed.

At step S103, etching an area of the active layer film 12 exposed outside to expose an area of the first insulating layer film 11 outside, and then etching the area of the first insulating layer film 11 exposed outside to form an intermediate pattern 14 of a via hole to be formed in the first insulating layer film.

The first insulating layer film 11 is formed by a chemical vapor deposition method. The active layer film 12 made of a material of indium gallium zinc oxide (IGZO) is formed by a sputtering deposition method. The first insulating layer film 11 is dry-etched or wet-etched to form the intermediate pattern 14 of the via hole to be formed in first insulating layer film. The active layer film 12 is wet-etched.

At step S104, ashing to remove a portion of the photoresist layer 13 in the area other than the second area, and reserving a portion of the photoresist layer 13 in the second area; and etching to form a pattern of the active layer 8.

At step S105, etching to form patterns of the first insulating layer 4 and the via hole 5 in the first insulating layer.

In this step, the first insulating layer film 11 is further etched, and finally, the patterns of the first insulating layer 4 and the via hole 5 therein are formed.

In the embodiment of the present disclosure, referring to FIG. 11, after the step S105, the method may further include steps S106 to S108.

At step S106, preparing a second conductive layer 3 on the base 1 subjected to the step S105.

In this step, the second conductive layer 3 and the first interconnection pattern in the second conductive layer 3 may be prepared by a patterning process (including steps of film formation, exposure, development, etching, and the like).

At step S107, preparing a second insulating layer 9 on the base 1 subjected to the step S106.

In this step, a second insulating layer film is formed by a chemical vapor deposition method, and a pattern of the second insulating layer 9 is formed by a dry etching or wet etching method.

At step S108: preparing a first electrode 10 on the base 1 subjected to the step S107.

In this step, a pattern of the first electrode 10 may be prepared by a patterning process (including steps of film formation, exposure, development, etching, and the like).

In the method for manufacturing the array substrate, the patterns of the active layer 8 and the first insulating layer 4 are formed by adopting the halftone mask plate through one exposure process, compared with the method in which each of the active layer 8 and the first insulating layer 4 is prepared by adopting one mask plate through one exposure process, one mask plate can be reduced, and one exposure process is reduced, so that the cost of manufacturing the array substrate is greatly reduced, and the productivity of the array substrate is improved.

In some implementations, in the method for manufacturing the array substrate, the preparing the first insulating layer and the preparing the active layer may also include steps S201 and S202.

At step 201, forming a first insulating layer film on the base prepared with the first conductive layer thereon; coating a photoresist layer on the first insulating layer film; exposing the photoresist layer by adopting a first mask plate including patterns of a first insulating layer and a via hole in the first insulating layer; developing and then etching to form the patterns of the first insulating layer and the via hole in the first insulating layer.

At step S202, forming an active layer film on the first insulating layer; coating a photoresist layer on the active layer film; exposing the photoresist layer by adopting a second mask plate including a pattern of an active layer; developing and then etching to form the pattern of the active layer.

The first insulating layer and the active layer may also be respectively prepared each by uisng one mask plate through one exposure process.

In the array substrate provided in the embodiment of the present disclosure, by providing the first interconnection pattern connected with the first wiring pattern in the second conductive layer, an area of a cross section of the first wiring pattern perpendicular to the base can be increased under a condition that a thickness of the first wiring pattern in the first conductive layer is reduced, so that a resistance of the first wiring pattern is reduced, the problems of reduction of the yield of products and increase in cost caused by the fact that the thickness of the first wiring pattern is increased are improved or avoided, and the display effect of the display panel adopting the array substrate for displaying with high resolution and high refresh rate is improved. The thickness of the second conductive layer may be made relatively large, so that the resistance of the wiring pattern in the second conductive layer is reduced, and the display effect of the display panel adopting the array substrate for displaying with high resolution and high refresh rate is improved. Since the second conductive layer is located on a side of the first conductive layer away from the base, that is, the second conductive layer is positioned in an upper layer relative to the base than the first conductive layer, the risk of short circuit between the second conductive layer and the first conductive layer would not be caused by increasing the thickness of the second conductive layer.

An embodiment of the present disclosure further provides a display panel, which includes the array substrate in the above embodiment.

By adopting the array substrate in the above embodiment, the yield of the display panel can be improved, the manufacturing cost of the display panel can be reduced, and the display effect of the display panel for displaying with high resolution and high refresh rate can be improved.

An embodiment of the present disclosure further provides a display device, which includes the display panel in the above embodiment.

By adopting the display panel in the above embodiment, the yield of the display device can be improved, the cost of manufacturing the display device can be reduced, and the display effect of the display device for displaying with high resolution and high refresh rate display can be improved.

The display device provided by the embodiment of the present disclosure may be any product or component with a display function, such as an LCD panel, an LCD television, an LED panel, an LED television, an OLED panel, an OLED television, a display, a mobile phone, and a navigator.

It will be understood that the above embodiments are merely exemplary embodiments employed to illustrate the principles of the present disclosure, but the present disclosure is not limited thereto. It will be apparent to those skilled in the art that various changes and modiifications may be made therein without departing from the spirit and scope of the present disclosure, and these changes and modifications are to be considered within the scope of the present disclosure.

What is claimed is:

1. An array substrate, comprising: a base; a plurality of gate lines and a plurality of data lines which are horizontally and vertically arranged on the base; a plurality of pixel units, each pixel unit at least comprises a thin film transistor; a first conductive layer and a second conductive layer; and a first insulating layer arranged between the first conductive layer and the second conductive layer; wherein the first conductive layer comprises a first wiring pattern, and the second conductive layer comprises a first interconnection pattern;

orthographic projections of the first wiring pattern and the first interconnection pattern on the base are at least partially overlapped with each other; the first wiring pattern is connected with the first interconnection pattern through a via hole formed in the first insulating layer;

among at least part of the data lines, each data line is located in the first conductive layer and is provided with an auxiliary line for the data line, and the auxiliary line for the data line is located in the second conductive layer;

the first wiring pattern comprises the data lines, and the first interconnection pattern is configured to be connected with the data lines to form auxiliary lines for the data lines; at least one of the data line and the first interconnection pattern is connected to a source of the thin film transistor, and wherein the first conductive layer and the second conductive layer are sequentially stacked in a direction away from the base;

the first wiring pattern serving as the data lines is a continuous wiring extending in a first direction;

the first interconnection pattern connected with the data lines comprises one or more first sub-patterns which are spaced apart from each other, and extending directions of the data lines and the first sub-pattern are consistent; an orthographic projection of each data line on the base and an orthographic projection of the first sub-pattern corresponding to the data line on the base at least partially overlap with each other;

the via hole comprises a first via hole, an orthographic projection of the first via hole on the base is located in an overlapping area of orthographic projections of the data line and the first sub-pattern on the base; the data line is connected with the first sub-pattern through the first via hole, and wherein the second conductive layer further comprises the source and a drain of the thin film transistor;

the first sub-pattern is connected with the source of the thin film transistor;

the first sub-pattern serving as the auxiliary lines for the data lines and the source and the drain of each thin film transistor are formed in a same process, so that the first sub-pattern and the source and the drain of each thin film transistor are located in a same layer, have a same thickness and made of a same material, and the first sub-pattern and the source of each thin film transistor are of an one-piece structure.

2. The array substrate of claim 1, wherein the orthographic projection of the first sub-pattern on the base is located within an area of the orthographic projection of the data line on the base; and a plurality of first via holes are provided in an area of the orthographic projection of each first sub-pattern on the base and are spaced apart from each other.

3. The array substrate of claim 2, wherein each of the first sub-patterns spaced apart from others of the first sub-patterns is located between two gate lines adjacent to each other;

the number of the first sub-patterns connected with each data line is equal to the number of the gate lines.

4. The array substrate of claim 3, wherein five to ten first via holes are provided in each of the first sub-patterns spaced apart from others of the first sub-patterns, and the first sub-pattern is connected with the data line through the five to ten first via holes.

5. The array substrate of claim 4, wherein the first conductive layer further comprises a gate, and the gate is connected to the gate line through a second via hole formed in the first insulating layer.

6. The array substrate of claim 5, wherein the thin film transistor further comprises an active layer located on a side of the first insulating layer away from the first conductive layer and on a side of the second conductive layer close to the first insulating layer;

orthographic projections of the active layer and the gate on the base are at least partially overlapped with each other; the source and the drain of the transistor are located at two opposite ends of the active layer respectively, and are connected with the active layer.

7. The array substrate of claim 6, wherein the first wiring pattern further comprises a third sub-pattern, and an extending direction of the third sub-pattern is the same as that of the gate line;

an orthographic projection of the third sub-pattern on the base is located in an area of an orthographic projection of the gate line on the base;

the via hole further comprises a third via hole, an orthographic projection of the third via hole on the base is located in an overlapping area of orthographic projections of the gate line and the third sub-pattern; and the third sub-pattern is connected with the gate line through the third via hole to form an auxiliary line for the gate line.

8. The array substrate of claim 7, wherein a plurality of third sub-patterns are provided, and the plurality of third sub-patterns are arranged at intervals in the extending direction of the gate line and are spaced apart from each other;

each of the third sub-patterns spaced apart from others of the third sub-patterns is provided between two data lines adjacent to each other;

the number of the third sub-patterns connected with each gate line is the same as the number of the data lines.

9. The array substrate of claim 8, wherein five to ten third via holes are provided in each of the third sub-patterns spaced apart from others of the third sub-patterns, and the third sub-pattern is connected with the gate line through the five to ten third via holes.

10. An array substrate, comprising: a base; a plurality of gate lines and a plurality of data lines which are horizontally and vertically arranged on the base; a plurality of pixel units, each pixel unit at least comprises a thin film transistor; a first conductive layer and a second conductive layer; and a first insulating layer arranged between the first conductive layer and the second conductive layer; wherein the first conductive layer comprises a first wiring pattern, and the second conductive layer comprises a first interconnection pattern;

orthographic projections of the first wiring pattern and the first interconnection pattern on the base are at least partially overlapped with each other; the first wiring pattern is connected with the first interconnection pattern through a via hole formed in the first insulating layer;

among at least part of the data lines, each data line is located in the first conductive layer and is provided with an auxiliary line for the data line, and the auxiliary line for the data line is located in the second conductive layer;

the first wiring pattern comprises the data lines, and the first interconnection pattern is configured to be connected with the data lines to form auxiliary lines for the data lines; at least one of the data line and the first interconnection pattern is connected to a source of the thin film transistor wherein the first conductive layer has a thickness less than a thickness of the second conductive layer;

the thickness of the first conductive layer is in a range from 2000 angstroms to 10000 angstroms;

the thickness of the second conductive layer is in a range from 3000 angstroms to 15000 angstroms.

11. A display panel, comprising the array substrate of claim 1.

12. A display panel, comprising the array substrate of claim 2.

13. A display panel, comprising the array substrate of claim 3.

* * * * *